(12) United States Patent
Nafziger

(10) Patent No.: US 9,824,775 B2
(45) Date of Patent: Nov. 21, 2017

(54) FEEDBACK VALIDATION OF ARBITRARY NON-VOLATILE MEMORY DATA

(71) Applicant: Texas Instruments Incorporated, Dallas, TX (US)

(72) Inventor: Jonathan William Nafziger, Houston, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/419,457

(22) Filed: Jan. 30, 2017

(65) Prior Publication Data

US 2017/0206981 A1     Jul. 20, 2017

Related U.S. Application Data

(63) Continuation of application No. 15/075,921, filed on Mar. 21, 2016, now Pat. No. 9,558,846.

(Continued)

(51) Int. Cl.
*G11C 16/06* (2006.01)
*G11C 29/12* (2006.01)
(Continued)

(52) U.S. Cl.
CPC ............. *G11C 29/12* (2013.01); *G11C 16/10* (2013.01); *G11C 16/28* (2013.01); *G11C 16/349* (2013.01)

(58) Field of Classification Search
CPC ......... G11C 29/12; G11C 16/10; G11C 16/28; G11C 16/349
See application file for complete search history.

(56) References Cited

U.S. PATENT DOCUMENTS 7,669,100 B2*  2/2010  Pelley ............ G01R 31/318513
                                                      714/715
7,961,530 B2*  6/2011  Kuroki ..................... G11C 7/24
                                                      365/185.04
(Continued)

OTHER PUBLICATIONS

Nafziger et al., "Method for Efficient Flash Bit Cell Current Compression in Deeply Erased Bits", 16th Int'l Symp. on Quality Electronic Design (IEEE, 2015), pp. 77-81.

(Continued)

*Primary Examiner* — Pho M Luu
(74) *Attorney, Agent, or Firm* — Kenneth Liu; Charles A. Brill; Frank D. Cimino

(57) ABSTRACT

An integrated circuit and method of performing a reliability screen of an electrically programmable non-volatile memory array in the integrated circuit. At a first memory address of the array, a most stringent value of a sensing reference level at which correct data are read is identified. The remainder of the addresses of the array are evaluated in sequence, beginning at the value determined for the first address, and incrementally adjusting the sensing reference level for each, if necessary, until correct data are read at that address. The sensing reference level may be a reference current applied to a sense amplifier, against which read current from the addressed memory cell is compared, or may be control gate voltage applied to the control gate of a floating-gate transistor in the addressed memory cell. The process continues until all addresses in the memory array have been evaluated, following which the reference level identifies the strength of the weakest cell in the array, and the weakest address can be identified.

22 Claims, 6 Drawing Sheets

Related U.S. Application Data

(60) Provisional application No. 62/250,710, filed on Nov. 4, 2015.

(51) Int. Cl.
  *G11C 16/34* (2006.01)
  *G11C 16/28* (2006.01)
  *G11C 16/10* (2006.01)

(56) References Cited

U.S. PATENT DOCUMENTS

| | | | |
|---|---|---|---|
| 8,773,922 B2 * | 7/2014 | Song | G11C 11/5642 365/189.07 |
| 9,773,922 B1 | 7/2014 | Song et al. | |
| 9,558,846 B1 * | 1/2017 | Nafziger | G11C 29/12 |

OTHER PUBLICATIONS

Cai et al., "Threshold Voltage Distribution in MLC NAND Flash Memory: Characterization, Analysis, and Modeling", Proc. of the Conf. on Design, Automation, and Test in Europe (IEEE, 2013), pp. 1285-1290.
Datasheet, "TMS570LS0232 16- and 32-Bit RISC Flash Microcontroller" (Texas Instruments Incorporated, Jun. 2015), pp. 1-5, 32-34, 49-51.
Datasheet, "TM5570LS0232 16- and 32-Bit RISC Flash Microcontroller" (Texas Instruments Incorporated, Jun. 2015), pp. 1-5, 32-34, 49-51.

* cited by examiner

000
FEEDBACK VALIDATION OF ARBITRARY NON-VOLATILE MEMORY DATA

CROSS-REFERENCE TO RELATED APPLICATIONS

This application is a continuation of and claims priority to U.S. patent application Ser. No. 15/075,921, filed Mar. 21, 2016, now issued U.S. Pat. No. 9,558,846, which claims priority to U.S. Provisional Patent Application Ser. No. 62/250,710, filed Nov. 4, 2015, all of which are incorporated herein by reference.

STATEMENT REGARDING FEDERALLY SPONSORED RESEARCH OR DEVELOPMENT

Not applicable.

BACKGROUND OF THE INVENTION

This invention is in the field of non-volatile memory integrated circuits. Embodiments of this invention are more specifically directed to testing of electrically programmable and erasable non-volatile memory for reliability parameters.

Non-volatile solid-state read/write memory devices are now commonplace in many electronic systems, particularly in portable electronic devices and systems. A common technology for realizing non-volatile solid-state memory devices involves the trapping of charge at or near the gate element of a metal-oxide-semiconductor (MOS) transistor in the programmable memory cell. In conventional electrically erasable programmable "read-only" memory (EEPROM) devices, programming by way of this charge-trapping mechanism is performed by biasing the transistor so that electrons tunnel through a thin dielectric film onto an electrically isolated transistor gate element (i.e., the "floating-gate" electrodes), or in some technologies, within the gate dielectric layer or at the silicon-dielectric interface. Depending on the construction of the transistor, the tunneling mechanism may be Fowler-Nordheim tunneling or channel "hot" carrier injection. In any case, the trapped electrons at the gate region raise the apparent threshold voltage of the memory cell transistor (for n-channel devices), as compared with the threshold voltage for the state in which no electrons are trapped at the gate. The stored state can be read by sensing the presence or absence of source-drain conduction under bias.

Modern EEPROM devices are "erasable" in that the memory cell transistors can be biased to remove the electrons from the floating gate, by reversing the tunneling mechanism. Some EEPROM memory devices are of the "flash" type, in that a large number (a "block") of memory cells are simultaneously erased in a single operation. Conventional EEPROM memories can be arranged in a "NOR" fashion, which permits individual cells in each column to be separately and individually accessed. Flash EEPROM memories are also now commonly arranged as "NAND" memory, in which the source/drain paths of a group of memory cells in a column are connected in series. NAND memories can be constructed with higher density, but require all of the cells in a group to be biased to access any one of the cells in that group.

FIG. 1a illustrates a typical manner in which the stored state of an EEPROM cell is sensed in conventional integrated circuits. In this example, floating-gate memory cell $2_{j,k}$ is a non-volatile memory cell, for example of the EEPROM or flash type, that resides in row j and column k of a memory array and that is being addressed in this read operation. The memory cells in that memory array may be arranged in either a NOR or NAND type, as known in the art; the unselected cells are not shown in FIG. 1a for the sake of clarity. In this example, EEPROM cell $2_{j,k}$ consists essentially of a single n-channel metal-oxide-semiconductor (MOS) transistor in which a floating gate electrode is physically disposed between a control gate and the channel region of the transistor. The control gate of this transistor of cell $2_{j,k}$ receives a control gate voltage $VCG_j$ for its row j, and its source and drain are coupled to bit line $BL_k$ for its column k as appropriate for its NOR or NAND configuration. The specific physical arrangement of the floating gate relative to the other elements of EEPROM cell 2 can vary depending on the particular design, as known in the art.

In conventional floating gate EEPROMs such as that including cell $2_{j,k}$ of FIG. 1a, an absence of trapped electrons at the floating gate electrode is considered as the "erased" state of the memory cell, and will be evident by the (n-channel) floating-gate transistor having a low threshold voltage. The "programmed" state in which electrons are trapped at the floating gate results in the floating-gate transistor having a high threshold voltage. Programming of cell $2_{j,k}$ is typically performed by the application of a sufficient drain-to-source drive along with a high voltage at the control gate that capacitively couples to the floating gate electrode. Under this bias, electrons can tunnel from the transistor drain or channel region to become trapped at the floating gate electrode, changing the threshold voltage of the device as a result. Erase of cell $2_{j,k}$ is accomplished by application of the opposite bias between the transistor channel region and the control gate, which draws the trapped electrons from the floating gate electrode.

To read the state of EEPROM cell $2_{j,k}$, a bit line voltage $VBL_k$ is coupled to one end of bit line $BL_k$ for the selected column k, and appears at the drain of the floating-gate transistor of cell $2_{j,k}$. In addition, a control gate voltage $VCG_j$ at a level V_Read is applied to the control gates of cells 2 in selected row j. The source of selected cell $2_{j,k}$ is coupled to one input of sense amplifier 4, which receives a reference current IREF_Read at its other input from reference generator 6. Sense amplifier 4 compares the bit cell current $BCC_{Bit}$ conducted by bit line $BL_k$ through the selected cell $2_{j,k}$ with the reference current IREF_Read, and presents a logic level at its output $DATA_{out}$ in response to that comparison.

Accordingly, the level at output $DATA_{out}$ reflects whether selected cell $2_{j,k}$ is in its programmed state or its erased state. As mentioned above, the programmed state of cell $2_{j,k}$ results in the floating-gate transistor having a high enough threshold voltage that the applied voltage V_read at the control gate will fail to turn the transistor on, as reflected by the bit cell current $BCC_{Bit}$ being below the reference current IREF_Read, resulting in a "0" logic level at output $DATA_{out}$ of sense amplifier 4. Conversely, because the floating-gate transistor has a low threshold voltage in the "erased" state of cell $2_{j,k}$, a control gate voltage of V_read is sufficient to turn on the transistor, which is reflected by the bit cell current $BCC_{Bit}$ being above the reference current IREF_Read and, in turn, sense amplifier 4 driving its output $DATA_{out}$ to a "1" logic level.

As known in the art, variations in programmability among the EEPROM cells of a device are present due to structural variations among the floating gate transistors, and manufacturing and processing variations from wafer to wafer. As a result, some EEPROM cells in a population will tend to not program or erase as strongly as others in the population;

these weaker cells are of course vulnerable to causing data errors as their programmability and data retention weaken even further over operating life. The binary information provided merely by reading the stored state of EEPROM cells provides little insight into the strength or weakness of the cells. Accordingly, test methods have been developed to determine the programmability of EEPROM cells in an integrated circuit, and if possible, to identify those cells that are most vulnerable, as will now be discussed with reference to FIG. 1b.

According to one approach described in Nafziger et al., "Method for efficient flash bit cell current compression in deeply erased bits", 16$^{th}$ *Int'l Symp. on Quality Electronic Design* (IEEE, 2015), pp. 77-81, incorporated herein by reference, the bit cell current $BCC_{Bit}$ for the weakest and strongest cell 2 in an array can be determined by modulating the reference current IREF_Read applied to sense amplifier 4 in reading the cells 2 in the array. FIG. 1b illustrates the relationship between control gate voltage VCG and the bit cell current $BCC_{Bit}$ for a population of EEPROM cells 2 including both erased bits (plots 10) and programmed bits (plots 12). As evident from plots 12, the programmed cells in this population exhibit very little bit cell current $BCC_{Bit}$, well below the nominal reference current level IREF_Read, when read at the nominal control gate voltage V_Read; conversely, plots 10 show that the erased cells exhibit bit cell currents $BCC_{Bit}$ above IREF_Read when read at the nominal control gate voltage V_Read. The most and least erased cells can be identified by sweeping the reference current IREF applied to sense amplifiers 4 during reads at control gate voltage V_Read. In this example, plot $10_{max}$ corresponds to the cell that exhibits the highest bit cell current $BCC_{Max}$ at the nominal read voltage V_Read; this cell is the most erased bit in the array. Conversely, plot $10_{min}$ corresponds to the erased cell that exhibits the lowest bit cell current $BCC_{Min}$ at the nominal read voltage V_Read; this cell is the least erased bit in the array.

Another conventional approach to evaluating the weakest and strongest cells in an EEPROM array involves the sweeping of the control gate voltage VCG applied to the control gates of cells 2 during reads at a constant level IREF_Read of the reference current applied to sense amplifiers 4, for example as described in Cai et al., "Threshold Voltage Distribution in MLC NAND Flash Memory: Characterization, Analysis, and Modeling", *Proc. of the Conf. on Design, Automation, and Test in Europe* (IEEE, 2013), pp. 1285-90. As evident from FIG. 1b, it has been observed that some programmed EEPROM cells do not exhibit weaker programmability at the relatively low control gate voltages (e.g., V_Read) typically applied in normal read operations, but can be differentiated at higher control gate voltages. For example, plot $12_{min}$ corresponds to a cell 2 that conducts a bit cell current IREF_Read at a relatively low control gate voltage $VT_{Min}$ as compared with normal cells exemplified by plots 12a, 12b.

The ability to test the "goodness" or strength of EEPROM cells by way of these BCC and VT screens is useful both at the time of manufacture, and also during the operating life of the integrated circuit, for example as part of a "built-in self-test" (BIST) routine executed on power-up of the integrated circuit. In either case, the test necessarily requires knowledge of the expected data for each cell under test. Typically, a regular data pattern such as all 0's, all 1's, checkerboard, diagonals, or the like that is either trivial or algorithmically generated is used, in order to minimize the requirements for local memory resources to store the expected data for the arrays.

Because of the convenience and efficiency of modern flash EEPROM memories, it is now desirable and commonplace to embed EEPROM memory within larger scale integrated circuits, such as those including modern complex microprocessors, microcontrollers, digital signal processors, and other large-scale logic circuitry. In addition to bulk non-volatile data storage, however, embedded EEPROM resources in microcontroller architectures are used to store executable software routines, configuration data, trim codes for on-die peripheral functions, and the like. Particularly in microcontroller architectures, some of these non-volatile memory resources may be pre-loaded by the manufacturer of the microcontroller with compiled assembly code and other irregular, non-algorithmically determinable, data sets. The irregularity and uniqueness of the pre-stored data in these embedded EEPROM resources render it difficult to carry out the BCC and VT reliability screening described above, especially in the BIST context. More specifically, in order for a BIST reliability screen to directly determine which memory cell is the weakest erased cell (i.e., exhibits the lowest bit cell current $BCC_{Min}$) or which is the weakest programmed cell (i.e., exhibits the lowest threshold voltage $VT_{Min}$), additional on-chip memory of the same size as the EEPROM array must be provided to store the irregular data set that is stored in the EEPROM array under test.

One known indirect approach for performing BCC and VT reliability screening of embedded EEPROM arrays that are storing irregular (i.e., not algorithmically determinable) data is illustrated in FIG. 2. In this example, plot 15 illustrates the actual distribution of bit cell currents BCC for each of the erased (i.e., "1" data state) cells in an EEPROM array, arranged by ascending memory address; these bit cell currents BCC correspond to the minimum reference current IREF at which the corresponding cells will fail to return the correct "1" data state when read. A similar plot (not shown) could be made for the programmed (i.e., "0" data state) cells. Because the data pattern is irregular, however, and because a copy of that irregular data pattern is not known by the device according to this indirect method, plot 15 is unknown at the time of the reliability screen according to this method; rather, the minimum bit cell current $BCC_{Min}$ of the least erased cell $2_{wk1}$ is the unknown to be determined.

In this conventional approach, a binary search of reference current IREF levels is performed, with the entire EEPROM array read at each of those IREF levels. First, the entire memory array is read at a reference current IREF_1 at which all erased cells are expected to provide the correct "1" data state. For example, reference current level IREF_1 for this first read may be the nominal level IREF_Read used in read operations during normal use. Based on the data read in this first read of the array, a checksum is calculated against which subsequent reads of the array will be compared. The EEPROM array is then read at a reference current level IREF_2 at which many, if not all, of the erased cells are expected to not provide the correct "1" data state, for example at the expected level of the most erased cell (bit cell current $BCC_{Max}$ as shown in FIG. 1b). The checksum calculated from these data will not match the correct checksum obtained at reference current level IREF_1. A next read of the array is performed at a reference current IREF_3 at the midpoint between the expected pass level IREF_1 and the expected fail level IREF_2, and the checksum from this read is compared against the correct checksum from the read at IREF_1. If the checksums match, the next reference current IREF will be at the midpoint between the failing level IREF_2 and the level IREF_3 at this most recent read. If the checksums do not match, as in the example of FIG. 2, the next reference current IREF_4 is at the midpoint between the passing level IREF_1 and the level IREF_3 of the most recent previous read. The process is repeated, modifying the reference current IREF in this manner, until the desired number of iterations have been performed. The minimum bit level current $BCC_{Min}$ can be considered as the lowest reference current IREF level at which the correct checksum was returned following a read of the array.

Additionally, or in the alternative, a similar binary search of the control gate voltages VCG may be carried out, for example to identify the minimum threshold voltage $VT_{Min}$ of the programmed "0" bits.

This conventional approach requires significant test time, however. Because an image of the programmed irregular data is not available or used in this screen, the pass/fail determination can be made only by reading the entire EEPROM array at each reference level in order to derive a checksum over the array. For the simple example of FIG. 2, five reads of the entire memory array are required, which can consume significant test time in modern embedded microcontrollers, especially during the power-up BIST sequence of a modern device. In addition, this approach does not provide a precise determination of the minimum bit level current $BCC_{Min}$ or minimum control gate voltage $VT_{Min}$, but instead only provides an estimate of that value at a resolution defined by the number of steps in the binary search (i.e., the number of reads of the full array). Furthermore, this conventional indirect approach cannot identify the weakest cell, because the pass/fail determination is made by comparing checksums.

BRIEF SUMMARY

Disclosed embodiments provide a method of performing a reliability screen for non-volatile memory resources, including embedded memories in a large-scale integrated circuit, that are storing irregular or unique data.

Disclosed embodiments provide such a method that can precisely determine the reference level of the weakest memory cell in such a screen.

Disclosed embodiments provide such a method that can identify the address of the weakest memory cell identified in such a screen.

Disclosed embodiments provide such a method that can be efficiently performed, for example in a built-in self-test (BIST) routine.

Other objects and advantages of the disclosed embodiments will be apparent to those of ordinary skill in the art having reference to the following specification together with its drawings.

According to certain embodiments, a method of performing a reliability screen of an electrically programmable non-volatile memory array in an integrated circuit, and an integrated circuit with built-in self-test circuitry incorporating such a method, may be implemented by determining a most stringent value of a sensing reference level for one or more memory cells at a first address, which is stored as a current least most stringent value. Each remaining memory address is then successively evaluated at the then-current least most stringent value until a failed read is detected. At that address, the least most stringent value is incrementally made less stringent until correct data is read from that address, and the least most stringent value is updated. The process continues until all addresses in the memory array have been evaluated; the last updated minimum reference level identifies the strength of the weakest cell in the array.

BRIEF DESCRIPTION OF THE SEVERAL VIEWS OF THE DRAWING

FIG. 1b illustrates plots of bit cell read current versus control gate voltage for a population of programmed and erased memory cells sensed according to the circuitry of FIG. 1a.

DETAILED DESCRIPTION

The one or more embodiments described in this specification are implemented into a large-scale integrated circuit, such as a microcontroller, using electrically programmable read-only memory (EEPROM) of the flash type, as it is contemplated that such implementation is particularly advantageous in that context. However, it is also contemplated that concepts of this invention may be beneficially applied to in other applications, for example into other types of integrated circuits and systems incorporating embedded or discrete non-volatile memory. Accordingly, it is to be understood that the following description is provided by way of example only, and is not intended to limit the true scope of this invention as claimed.

Figure 3:
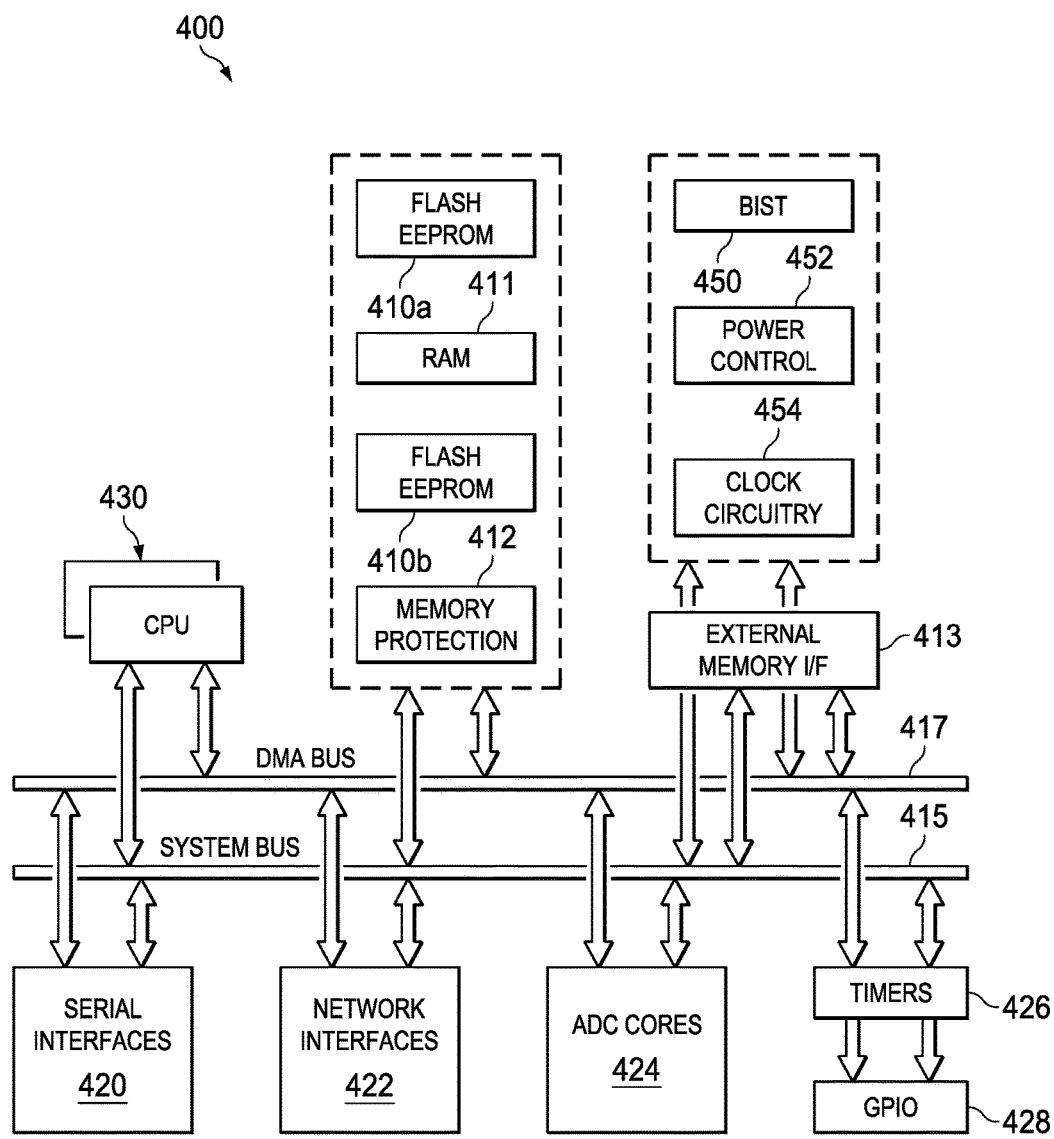
FIG. 3 is an electrical diagram, in block form, of a microcontroller constructed according to embodiments.

FIG. 3 illustrates, in block diagram form, the generalized architecture of an example of microcontroller 400 constructed according to these embodiments. In this example, microcontroller 400 as shown in FIG. 3 follows the generalized architecture of a modern microcontroller such as in the HERCULES family of microcontrollers available from Texas Instruments Incorporated. Those skilled in the art having reference to this specification will recognize that microcontroller 400 may include additional or alternative functions beyond those shown in FIG. 3, or may have its functions arranged according to a different architecture from that shown in FIG. 3.

In microcontroller 400, as typical in the art, one or more CPUs 430 serve as the central processing unit (CPU) of microcontroller 400, an example of CPU 430 is a microprocessor such as an ARM CORTEX processor as implemented in the HERCULES family of microcontrollers. FIG. 3 suggests that microcontroller 400 includes multiple instances of CPUs 430, each which may be of the same type or which may be processors of other types such as generic programmable processors, digital signal processors (DSPs) or other application-specific or customized logic, including fixed sequence generators, as appropriate for the particular function of microcontroller 400.

Memory resources in microcontroller 400 are provided by non-volatile memory arrays 410a, 410b, and random access memory (RAM) 411, at least a portion of each of which is accessible to CPUs 430 by way of system bus 415. Direct memory access (DMA) bus 417 is also provided, by way of which the various functions of microcontroller 400 may access these memory resources without the involvement of CPUs 430. In this example, each of memory arrays 410a, 410b is realized by electrically erasable programmable read-only memory (EEPROM) of the "flash" erase type; alternatively, other types of programmable non-volatile memory, such as ferroelectric memory (FRAM) and the like may be additionally or alternatively be used. While flash EEPROM arrays 410a, 410b, and RAM 411 are shown in FIG. 3 as unitary blocks, these memory resources may alternatively be realized as multiple memory blocks or arrays. Particularly in the case of RAM 411, these memory instances may be realized by any one or more of a number of memory cell types and arrangements, including static RAM (SRAM), dynamic RAM (DRAM), and the like. Other types of memory, such as mask-programmable read-only memory (ROM), one-time-programmable (OTP) ROM, non-flash EEPROM memory; and the like may additionally or alternatively be provided as desired. In addition, again particularly for the case of RAM 411, it is contemplated that individual instances of memory resources may have any one of a number of access architectures, including single-port and double-port access types. In this arrangement, some or all of these memory resources may be realized as "protected" memory, in the sense that their contents may be altered only by trusted applications or functions within or accessible from microcontroller 400, memory protection function 412 is thus provided in connection with these memory resources, as shown in FIG. 3.

Various peripheral functions may be also coupled to system bus 415 and DMA bus 417 so as to be accessible to CPU 430 and to one another. In the architecture of FIG. 3, these peripherals include serial interfaces 420, network interfaces 422, various signal processing functions such as analog-to-digital (ADC) cores 424, timers 426, general purpose input/output (GPIO) interface 428, and the like. These various peripheral functions may be within the address space of microcontroller 400, as suggested by their accessibility via buses 415, 417; alternatively, one or more of these or other functions may be accessible to CPUs 430 directly or via other functional circuitry, as known in the art. Microcontroller 400 also includes other functions such as power controller 452, clock circuitry 454, external memory interface 413, and other conventional support functions as known in the art.

In addition to the various memory resources 410, 411 that are accessible via system bus 415 and DMA bus 417, it is contemplated that many of the circuit functions within microcontroller 400 may themselves include local memory resources that are not directly accessible to CPUs 430. For example, digital functions such as the various interfaces 420, 422, ADC cores 424, timers 426, and the like may include blocks of RAM for data storage, or flash or other non-volatile memory for storage of configuration data or program instructions. Especially for those functions that operate largely in the digital domain, these memory resources may collectively, if not individually, occupy significant chip area in microcontroller 400. As mentioned above, these distributed memory resources are often pre-programmed by the manufacturer of microcontroller 400, considering that they may not be directly accessible to CPU 430 via buses 415, 417 or otherwise. CPU 430 itself may also include local memory resources, for example one or more levels of cache memory as known in the art.

In a more general sense, it is contemplated that the various memory resources and other functions in the architecture of microcontroller 400 may not be physically realized in the arrangement shown in FIG. 3, but may instead be placed at various locations within the integrated circuit. In this regard, those memory resources and other functions may in fact be physically (and logically, for that matter) distributed as multiple instances of microcontroller 400. These and other variations in the arrangement of microcontroller 400 that will be apparent to those skilled in the art having reference to this specification are contemplated to be within the scope of this disclosure.

According to these embodiments, microcontroller 400 includes built-in self-test (BIST) circuitry 450, which controls the execution of self-test program routines for microcontroller 400. It is contemplated that BIST 450 may have an external interface so as to receive commands from automated test equipment (not shown), and to communicate test results in response. Additionally or in the alternative, BIST 450 may perform a self-test function upon power-up of microcontroller 400, as known in the art. In any case, according to these embodiments, BIST 450 is coupled to memory resources 410a, 410b, 411, and to other functions of microcontroller 400 that include local memory, including CPU 430 in this example. The particular BIST data paths by way of which BIST 450 communicates with these various memory resources are not shown in FIG. 3, for the sake of clarity.

Figure 4:
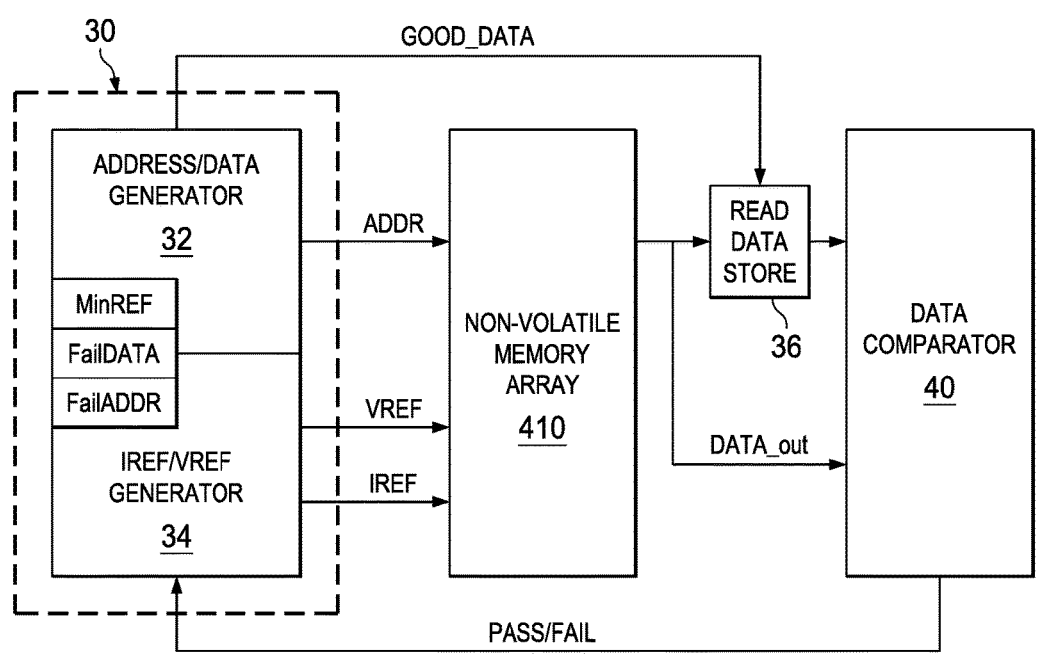
FIG. 4 is an electrical diagram, in block form, of a memory and test architecture for performing reliability screening according to an embodiment.

FIG. 4 illustrates the functional architecture of BIST 450 in microcontroller 400 of FIG. 3 as it performs a reliability screen of non-volatile memory array 410 according to an embodiment. Array 410 in FIG. 4 may, for example, refer to one of flash EEPROM arrays 410a, 410b in the block diagram of FIG. 3, or may refer to one of the distributed programmable non-volatile memory arrays located within one of CPUs 430, or one of the other functions of microcontroller 400 as described above. For purposes of this description, memory array 410 of FIG. 4 is contemplated to include the appropriate address decoders, sense amplifiers, clock circuits, and input/output functions for operating as an addressable memory resources. It is contemplated that those skilled in the art having reference to this specification having reference to this specification will be able to realize this test architecture of FIG. 4 according to this embodiment in a particular architecture, without undue experimentation.

In this test architecture, sequential logic in the form of state machine 30 includes the functions of address/data generator 32 and reference level (IREF/VREF) generator 34, among such other functions as necessary or appropriate to carry out the reliability screen of these embodiments described below. As shown in FIG. 4, address/data generator 32 applies memory address ADDR to memory array 410 that is under test, and may also forward expected data GOOD_DATA to read data store 36. Read data store 36 may be realized as one or more register locations, one or more sets of flip-flops or other latches, or a relatively small RAM of sufficient size to store one or more data words read from memory array 410, but otherwise need not be of a size capable of storing a significant portion of the contents of memory array 410. IREF/VREF generator 34 of state machine 30 includes logic operable to select and apply reference current IREF and control gate voltage VREF to memory array 410 under test. Data read from memory array 410 on lines DATA_out are applied to read data store 36, and to data comparator 40 in this arrangement. State machine 30 also includes one or more registers or memory locations ("stores") MinREF, FailADDR, FailDATA that store parameters of a reliability screen according to these embodiments, as will be described below.

In its general operation during the test of memory array 410, specifically for a read operation, state machine 30 issues a memory address on lines ADDR to memory array 410, along with the desired reference levels on lines IREF, VREF for use in sensing the data stored by the memory cells of array 410 corresponding to the address on lines ADDR. As will be evident from the more detailed description below, the location at address ADDR may initially be read under relaxed conditions, for example specifically with the reference levels IREF, VREF set so that the correct data are expected (e.g., from previous verification) to be output by memory array 410. These correct data from that location may be communicated back to state machine 30, and forwarded on lines GOOD_DATA to read data store 36 for use during subsequent reads of that location as described below. During this screen, the data read from memory array 410 are communicated on lines DATA_out to data comparator 40, for comparison with the expected data stored in read data store 36; data comparator 40 forwards the result of that comparison back to state machine 30 on lines PASS/FAIL.

It is of course contemplated that variations or alternatives to the test architecture of FIG. 4, for performing the operations described below, will be apparent to those skilled in the art having reference to this specification.

A method of performing a reliability screen of memory cells in a programmable read-only memory array 410 according to an embodiment will now be described in detail with reference to FIG. 5. This method will be described in the context of an overall test procedure applied to microcontroller 400 such as may be performed in a manufacturing test executed by automated test equipment, or by way of a power-on self-test carried out by BIST 450 (FIG. 3). In the BIST context, it is therefore contemplated that BIST 450 is programmed or otherwise arranged to effect the operations and decisions of these embodiments, such as described with reference to FIG. 5; if the reliability screen is performed by BIST 450 executing program instructions, it is therefore contemplated that program memory storing those executable instructions will be provided either within BIST 450 or elsewhere in microcontroller 400, as conventional in the art.

It is assumed, for purposes of this description, that the functionality of memory array 410 has been verified to properly store and retrieve data (i.e., that all enabled memory cells are operable); other functional and parametric tests will typically be performed as part of that larger sequence. As mentioned above, it is contemplated that, at the time that this reliability screen is performed according to this embodiment, the precise data stored in memory array 410 is not stored elsewhere in microcontroller 400 or in an external tester that may be carrying out this reliability screen, and is not algorithmically determinable (e.g., as in a regular pattern, such as checkerboard or diagonal). However, it is contemplated that previous operations have provided a checksum value against which the state of memory array 410 may be compared.

As will be apparent from the following description, the reliability screen of memory array 410 will be performed by "sweeping" one of the sensing reference levels used in sensing stored data in read operations, while holding other sensing reference levels (if any) constant. In a general sense, this reliability screen determines the "least most stringent" value of the swept sensing reference value over the memory locations of memory array 410. In the example to be described below, the sensing reference level of reference current IREF applied to sense amplifiers in memory array 410 will be swept to evaluate the reliability of erased cells in that array; other sensing reference levels, such as the reference voltage VREF applied as the control gate voltage VCG to the addressed memory cells of array 410, will be held constant, for example at a nominal level. In this example, therefore, the least most stringent value of reference current IREF will be the minimum, over the population of erased memory cells, highest reference current level at which each erased cell returns a "1" data state. Conversely for programmed cells, the least most stringent value of reference current IREF will be the maximum, over the population of programmed memory cells, lowest reference current level at which each programmed cell returns a "0" data state.

Alternatively or as an additional screen, reference voltage VREF (i.e., the applied control gate voltage) may be the sensing reference level that is swept to carry out the reliability screen, with reference current IREF held constant at a nominal level. In this case, the least most stringent value of reference voltage VREF for programmed cells will be the minimum, over the population of programmed memory cells, highest control gate voltage at which each programmed cell returns a "1" data state (e.g., bit cell current $BCC_{Bit}$ below IREF_Read). Conversely for erased memory cells, the least most stringent value of reference voltage VREF will be the maximum, over the population of erased memory cells, lowest control gate voltage at which each erased cell returns a "0" data state.

Figure 5:
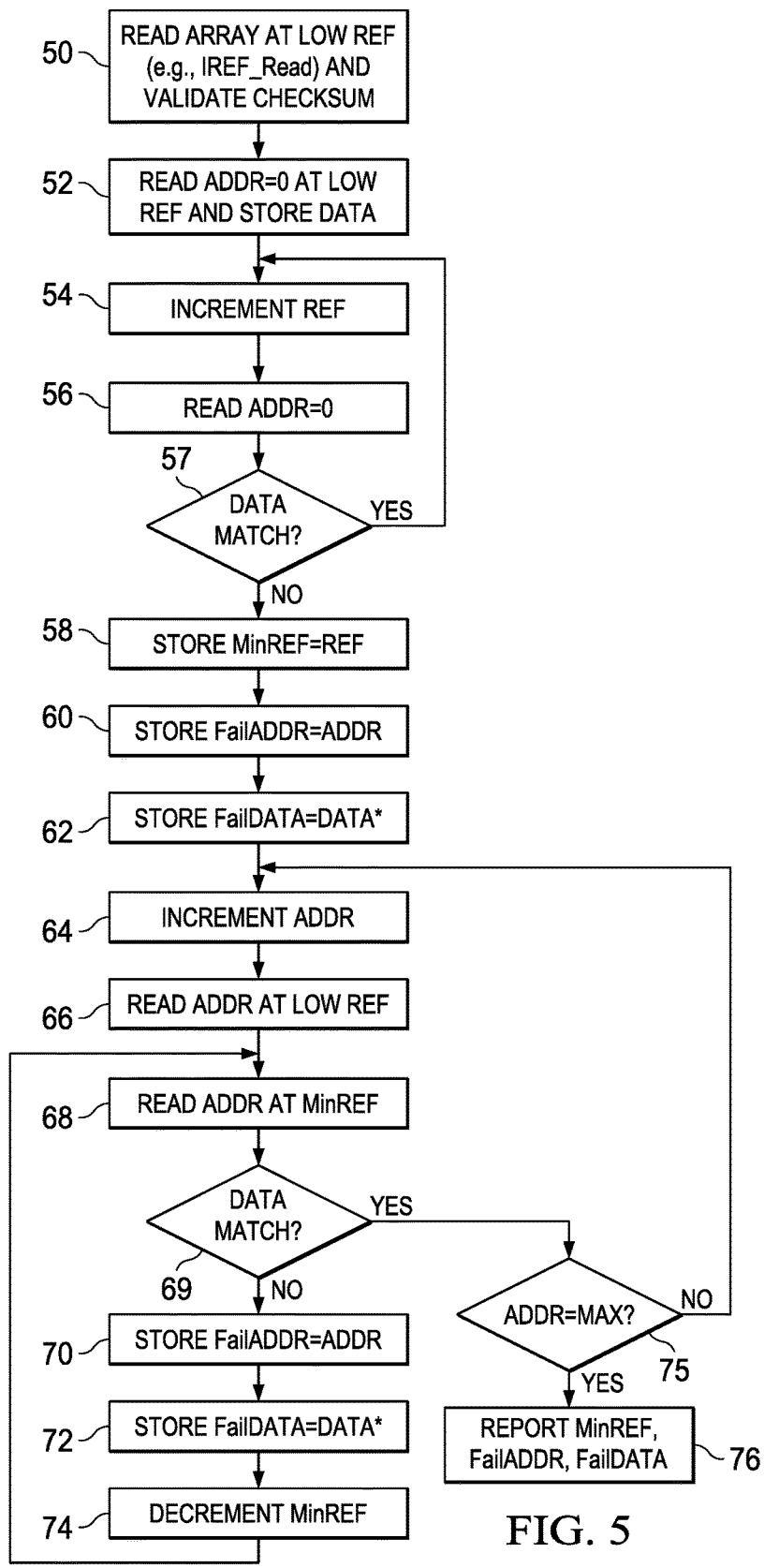
FIG. 5 is a flow diagram illustrating a method of performing reliability screening according to the architecture of FIG. 4.

It is contemplated that those skilled in the art having reference to this specification will be readily able to implement the method of FIG. 5 so as to sweep either reference voltage VREF or reference current IREF, for either programmed or erased cells, without undue experimentation. For non-volatile memories sensed in a different manner, it is contemplated that those skilled in the art having reference to this specification will similarly be able to implement these embodiments, in the context of the appropriate sensing reference levels for that sense scheme.

Figure 1A:
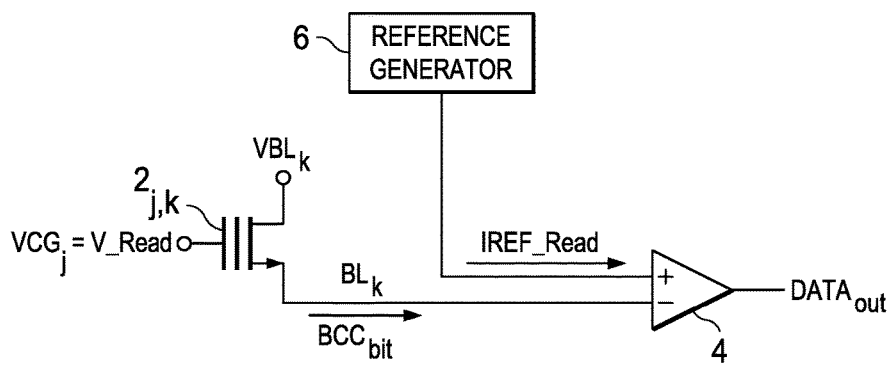
FIG. 1a is an electrical diagram, in block and schematic form, of conventional circuitry for sensing of a floating-gate non-volatile memory cell.

The method of this embodiment begins with process 50, in which the entire memory array 410 is read under conditions at which the correct data are expected to be returned. Referring to the description of the sensing operation above relative to FIGS. 1a and 1b, these conditions may be with a control gate voltage VCG at nominal reference level VREF_Read, and with the reference current IREF applied to sense amplifiers 8 at its nominal level IREF_Read. Under these relaxed conditions, considering the previous verification of the erased and programmed states of the various cells during the erase and programming operations, respectively, it is expected that the correct stored data will be obtained over the array. As the data are read in this process 50 from the entire array 410, a checksum is calculated in the conventional manner from those data, and that checksum is compared against a previously obtained and stored checksum value to verify that the stored data can be accurately read from memory array 410 under these relaxed conditions at this point in the test process.

In process 52, state machine 30 applies a first memory address ADDR[0] to memory array 410 in combination with reference level IREF at a low level, namely a level at which the correct data are expected to be returned. In this example, and as described above relative to FIGS. 1a and 1b, higher levels of reference current IREF are more stringent in reading erased ("1") EEPROM cells, and lower levels of reference current IREF are more relaxed for erased cells. As such, reference level IREF applied in process 52 may be the same as, or lower (i.e., less stringent) than, the IREF_Read level applied in process 50, but ought not be any higher (i.e., more stringent). The actual data read from address ADDR[0] in process 52 are stored in read data store 36 according to the test architecture of FIG. 4. The word width of the data read from ADDR[0] in this process 52, and from each address location of memory array 410 in this method, will of course depend on the architecture of memory array 410, and may of course vary from a single bit to a multi-bit data word (e.g., thirty-two bits).

In process 54, reference current IREF is incremented to a more stringent value (i.e., higher), and the memory location at address ADDR[0] is again read in process 56. The data read in process 56 at the higher reference level IREF are compared with the data read in process 52; if these data match (decision 57 is "yes"), reference level IREF is again incremented in process 54, ADDR[0] is again read in process 56, and decision 57 again evaluates whether the data match. This loop continues, with reference level IREF iteratively increasing (i.e., becoming more stringent), until decision 57 determines that the data read in the previous instance of process 56 do not match the data originally read in process 52 at the relaxed reference current. At this point, the current, incremented, reference level IREF is stored in the MinREF store of state machine 30, in process 58. The current memory address ADDR[0] is stored in the FailADDR store in process 60. An indication DATA* of the bits of the data read in process 56 that differ from the correct data at address 0 is stored in the FailDATA store in process 62. For example, the indication DATA* may correspond to the exclusive-OR of the data read in the last instance of process 56 with the correct data read in process 52.

Following the storing of the current minimum reference level in the MinREF store, and its memory address and failed data, in processes 58, 60, 62, address generator 32 of state machine 30 increments the memory address in process 64, and IREF/VREF generator 34 applies the low reference level at which the correct data are expected to be read (e.g., IREF=IREF_Read) for a read of the incremented address location of memory array 410 in process 66. It is not essential that the memory addresses increment sequentially in performing this reliability screen, so long as each memory location of memory array 410 is evaluated; the regular sequence of this example is of course a convenient way to keep track of which locations have and have not yet been evaluated. In process 68, this same incremented address location is read again, but with reference level IREF set at the current level stored at MinREF. At this first instance of process 68, the MinREF value is the highest reference level at which ADDR[0] returned correct data. In decision 69, the data read in process 68 at the current memory address are compared with the data read from this address in process 66 at the current MinREF level. If the data from the two reads do not match (decision 69 is "no"), the bit cell current from the current memory address (i.e., from at least one bit at that address) is weaker than the current minimum reference current IREF stored in MinREF. Accordingly, the current memory address ADDR, which is now the weakest erased memory location encountered so far, is stored in the FailADDR store in process 70, and an indication DATA* of the failing bit or bits in these data is stored in the FailDATA store in process 72. The MinREF reference level is decremented (and stored) in process 74, this same memory location is again read at the next lower (i.e., less stringent) reference level IREF in process 68, and the retrieved data compared against the correct data read in process 66. If the data again fail to match (decision 69 is "no"), the MinREF reference level is decremented again in process 74 and another read is performed in process 68; this loop continues until a sufficiently low reference level IREF is reached at which the current memory location is correctly read (decision 69 is "yes"). This currently weakest memory address has been maintained in the FailADDR store since the first pass through process 70, but the most recent fail data indication DATA* is stored in the most recent pass through process 72.

Upon decision 69 indicating that the data read in the most recent process 68 at the current MinREF level match those read in process 66 at the less stringent reference level (decision 69 is "yes"), decision 75 is then evaluated to determine whether the current address is the maximum address (i.e., at the end of the array). If not (decision 75 is "no"), the loop begins again by incrementing the memory address in process 64, and the contents of this memory location are read at the nominal reference level (e.g., IREF=IREF_Read) in process 66 to obtain the correct data for comparison with the reads at lower reference levels (process 68). The current minimum reference level MinREF applied in the next instance of process 68 at the incremented address is the highest passing reference level for the current weakest address in FailADDR.

Operation of this reliability screening method continues in this manner, until the maximum address location of memory array 410 has been evaluated (decision 75 is "yes"). At this point, the then-current contents of the MinREF, FailADDR, and FailDATA stores are reported to BIST 450, to the external test equipment, or are otherwise stored for later interrogation. According to this embodiment, the MinREF store contains the minimum bit cell current $BCC_{Min}$ (i.e., the lowest failing reference level IREF) for any memory location in memory array 410, which provides a measure of the strength or weakness of the weakest erased bit in the array. The FailADDR store contains the address of that weakest erased bit, and the FailDATA store provides an indication of which bit (i.e., which EEPROM cell) at the FailADDR memory address is the weakest.

Figure 2:
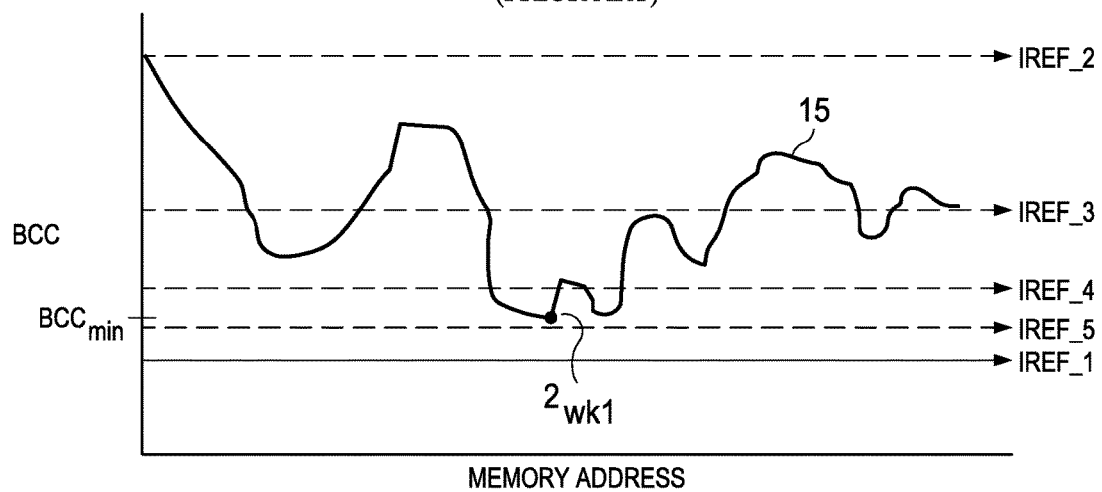
FIG. 2 is a plot of bit cell current versus memory address for a population of erased memory cells, illustrating an example of a conventional approach for performing reliability screening of a memory array storing an irregular data set.
Figure 6:
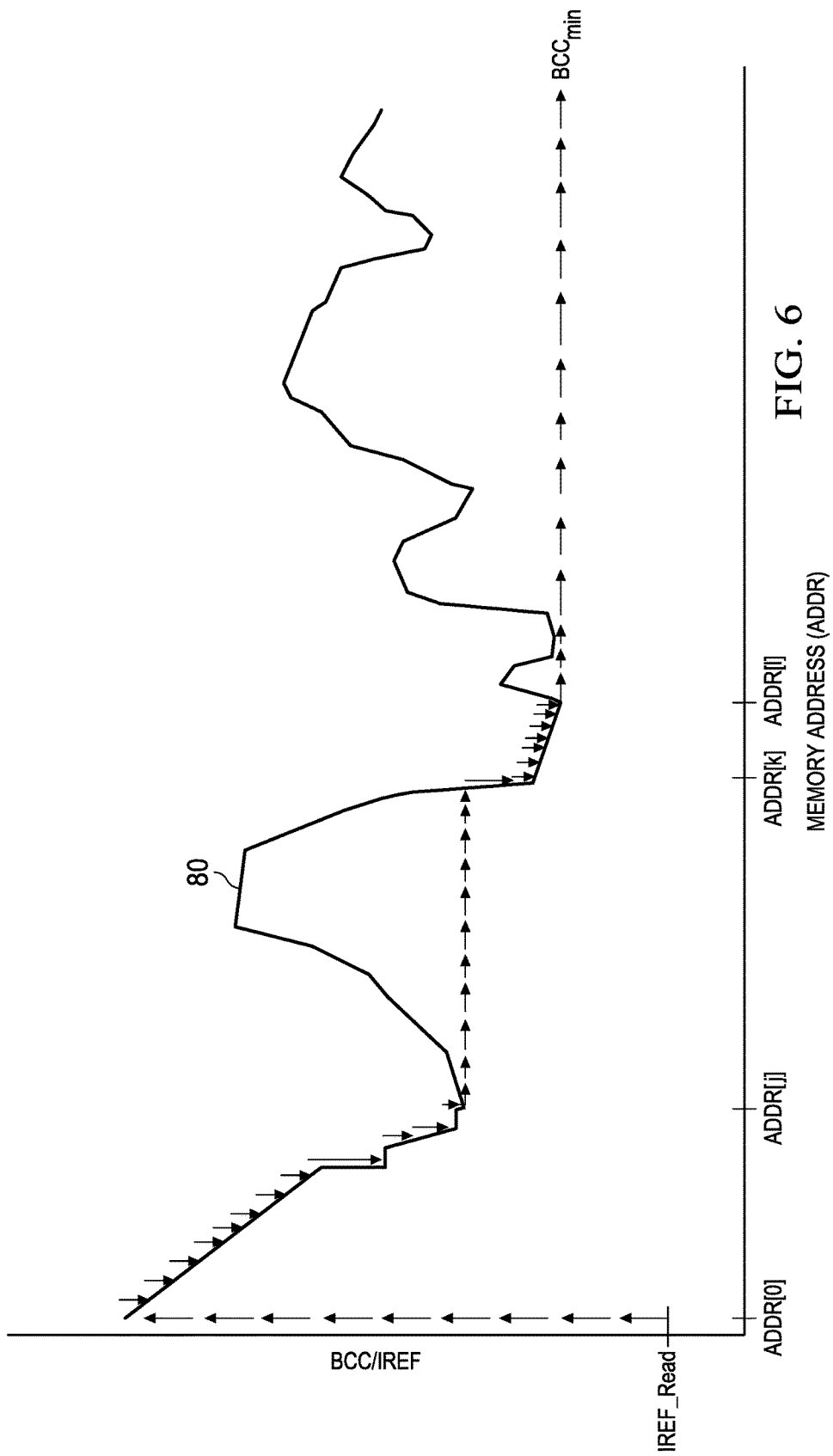
FIG. 6 is a plot of bit cell current versus memory address for a population of erased memory cells, illustrating an example of the method of FIG. 5.

FIG. 6 illustrates an example of the application of the method of FIG. 5 to a population of erased EEPROM cells in an instance of memory array 410, in the form of a plot 80 of the bit cell current BCC for each memory location in the array, arranged by ascending memory address, as discussed above relative to FIG. 2. As mentioned above, the attributes of this plot 80 are unknown at the time of the reliability screen according to this embodiment. As shown in FIG. 6, reference current level IREF_Read is significantly below the bit cell current for each of the cells in array 410 in this example. FIG. 6 also illustrates the operation of the loop of processes 54, 56 and decision 57 in increasing reference level IREF for the repeated reads at address ADDR[0] until reference level IREF equals the bit cell current BCC at address 0, resulting in the failed read in the last instance of process 56 (decision 57 returns a "no").

In this example of FIG. 6, the next few memory addresses following ADDR[0] exhibit lower bit cell currents BCC (i.e., lower reference levels IREF at which incorrect data are read) than did memory location ADDR[0]. Accordingly, plot 80 of bit cell current falls from address ADDR[0] until a minimum is reached at address ADDR[j]. As such, in the operation of the reliability screen of FIG. 5, decision 60 returns a "no" result at least once for each of the successive memory addresses between ADDR[0] and ADDR[j], and the minimum reference level stored at MinREF decreases over these addresses, reaching a local minimum at memory address ADDR[j]. The next few addresses following ADDR [j], until address ADDR[k], exhibit bit cell currents that are higher than the MinREF value of ADDR[j], and as such decision 69 will return a "yes" result following the first instance of read process 68 for those addresses. Address ADDR[k] exhibits a bit cell current weaker than that of ADDR[j], and as such decision 69 will return a "no" result at least once for that address, further reducing the contents of MinREF. In this example, MinREF is decremented at least once for each of the addresses following address ADDR[k], until address ADDR[l], which exhibits the minimum bit cell current $BCC_{min}$ over the entire population of erased cells in memory array 410 in this example, with the MinREF level set in the processing of address ADDR[l] is lower than the bit cell currents of the remainder of the memory addresses in this population. As a result, the process of FIG. 5 according to this embodiment will report the contents of the MinREF store derived from address ADDR [l], along with address ADDR[l] itself stored in the FailADDR store, and the data indication DATA* from the last failing read at ADDR[l] as stored in the FailDATA store.

Certain variations and alternatives to the embodiment of this reliability screen described above relative to FIGS. 5 and 6 are contemplated. As described above, the reference level stored in the MinREF store corresponds to the highest value of the reference current at which the weakest memory address returns the correct data; alternatively, it is contemplated that this MinREF level may correspond to the lowest value of reference current at which the weakest memory address returns incorrect data, if the order of process steps is altered from that described above.

Further in the alternative, it is contemplated that this embodiment may be used to similarly evaluate the "goodness" or strength of the programmed cells, for example by determining the maximum reference current level at which the weakest programmed cells first fail to return the correct "0" data state. For example, this alternative screen could be performed by storing a "MaxREF" current level corresponding to the bit cell current exhibited at which the programmed cells of the first memory address ADDR[0] first return the correct "0" value, and then increasing (i.e., making less stringent) this MaxREF value as weaker programmed cells are evaluated over the remainder of the array. For memories that behave similar to that described above relative to FIG. 1b, it may be necessary to set the control gate voltage at a more stringent (i.e., higher) voltage in this case.

Figure 1B:
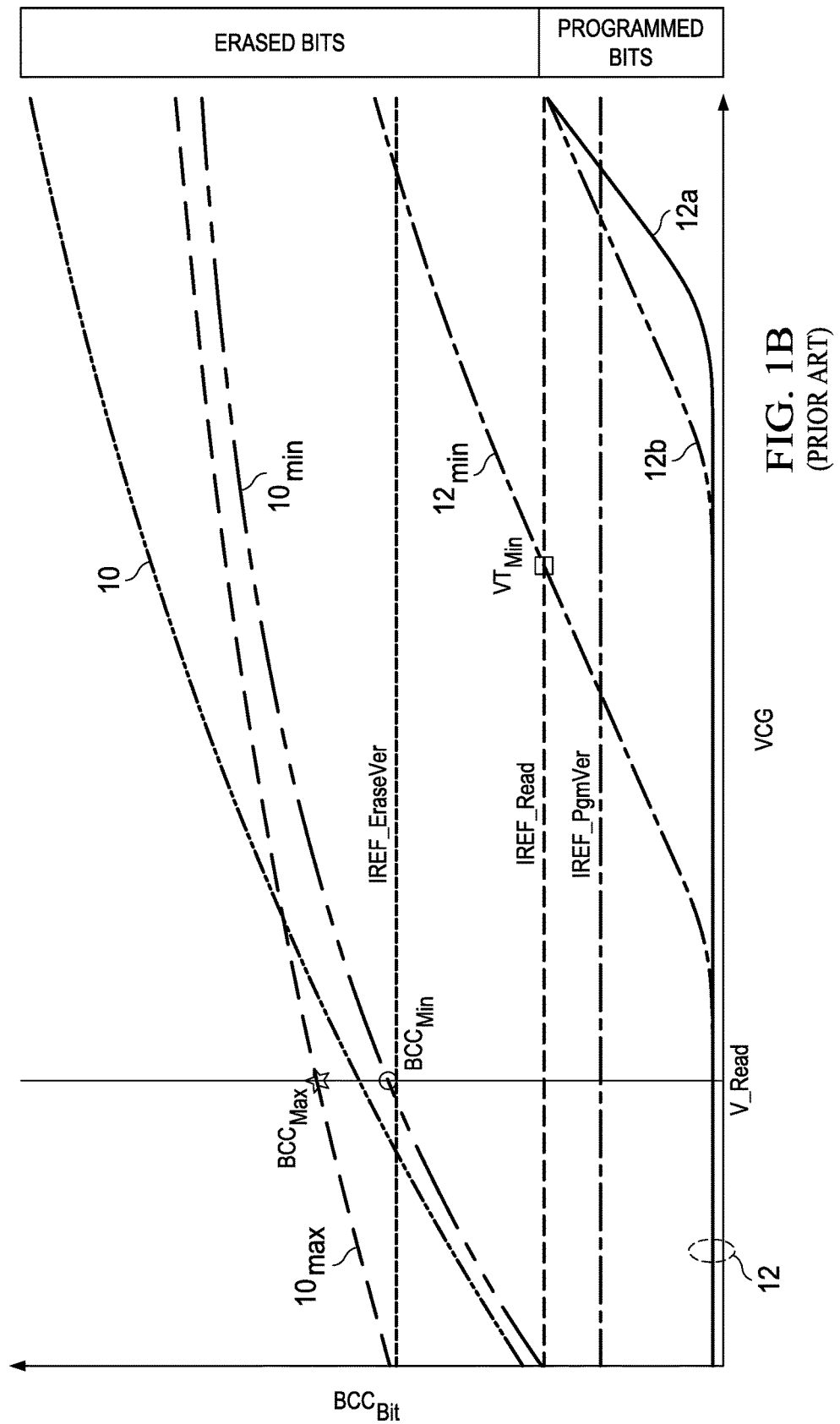

Still further in the alternative, as discussed above, sensing reference levels other than the reference current IREF applied to the sense amplifiers in the EEPROM architecture described above may be evaluated in this manner. For example, the reference current IREF applied to the sense amplifiers may be held constant (e.g., at the IREF_Read level shown in FIG. 1b) and the control gate voltage applied to the addressed cells varying so as to determine the minimum threshold voltage $VT_{Min}$ at which the weakest programmed cell returns the correct programmed data value ("0"), as shown in FIG. 1b. Conversely, the control gate voltage may be varied to determine a maximum threshold voltage at which the weakest erased cell returns the correct erased data value ("1"); for this screen of this erased state, it may be necessary to raise the reference current IREF to a more stringent (higher) level.

The reliability screen according to these embodiments and alternatives is contemplated to provide one or more important advantages in the test and evaluation of non-volatile memories, particularly embedded memories that pre-store irregular or unique data sets that cannot be algorithmically determinable. As evident from the foregoing description, a reliability screen according to these embodiments does not require knowledge or thus storage of the expected data stored in the memory array under test, but need only temporarily store the data word retrieved from a single address for comparison over the varying reference levels applied to that address. As such, this reliability screen can be efficiently performed as part of the BIST routine for embedded non-volatile memory, without requiring the implementation of a significant additional memory space for storage of expected data. Despite not storing the expected data for the array, the reliability screen according to these embodiments can provide the memory address of the weakest cells, and more specifically the particular weakest bit at that weakest address; conventional screens of embedded memories storing irregular data patterns are unable to provide such detailed information.

In addition, the reliability screen according to these embodiments can be performed in far fewer operations than the conventional screens for embedded memories storing irregular data patterns. For example, the conventional reliability screen described above with reference to FIG. 2 requires at least five reads of the entire array under test, to provide a minimum bit cell current even at a relatively coarse resolution; additional reads of the entire array are necessary to provide a higher resolution result. In contrast, the screen according to these embodiments can be carried out in as few as three reads of the full array, plus a few additional read cycles at some of the memory addresses. For example, referring to FIG. 5, one full array read is performed to verify the array contents in process 50, one full array read is required for each memory location in processes 52 and 66 to obtain the correct data, and at least one read of each memory location at the current MinREF value in process 68 is required; additional reads, but at individual addresses only, are performed upon encountering a new weakest cell. Accordingly, the reliability screen according to these embodiments can readily be realized either in the manufacturing context or as part of a BIST routine at power-up of the microcontroller or other large-scale integrated circuits, without unduly adding to the overall test time of the device.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of performing a reliability screen of a memory array including non-volatile memory cells, the method comprising:
   programming each of a plurality of the non-volatile memory cells to a first data state;
   determining a current value of a sensing reference level for a first address location of the memory array, the current value corresponding to a highest value of the sensing reference level at which performing a read operation on one or more memory cells corresponding to the first address location returns correct data;
   for each of a remaining plurality of address locations in the memory array:

reading one or more memory cells corresponding to the address location using the current value of the sensing reference level;

in response to the one or more memory cells returning incorrect data when read at the current value of the sensing reference level, updating the current value of the sensing reference level by decrementing the sensing reference level and then repeating the reading of the one or more memory cells; and in response to the one or more memory cells returning correct data when read at the current value of the sensing reference level, advancing to a next address location and repeating the reading and updating steps or the advancing step; and reporting the current value of the sensing reference level.

2. The method as claimed in claim 1, wherein the memory cells each comprise a floating gate metal-oxide semiconductor (MOS) transistor and the first data state corresponds to an erased state of the floating gate MOS transistor.

3. The method as claimed in claim 2, wherein the sensing reference level is a reference current, a reference voltage, or a control gate voltage.

4. The method as claimed in claim 1, wherein the first data state is a logical 1.

5. The method as claimed in claim 1, wherein determining the current value of a sensing reference level for the first address location comprises:

reading the one or more memory cells corresponding to the first address location using an initial nominal value of the sensing reference level;

incrementing the initial nominal value of the sensing reference level to obtain an increased sensing reference level;

reading the one or more memory cells using the increased sensing reference level;

comparing data read from the one or more memory cells using the increased sensing reference level to data read from the one or more memory cells using the initial nominal value of the sensing reference level;

in response to the comparing indicating the data read using the increased sensing reference level matches the data read using the initial nominal value of the sensing reference level, updating the increased sensing reference level by incrementing the sensing reference level and repeating the steps of reading of the one or more memory cells using the increased sensing reference level and comparing the data read using the increased sensing reference level to the data read using the initial nominal value of the sensing reference level until the comparing indicates that the data read using the increased sensing reference level and the data read using the initial nominal value of the sensing reference level do not match; and in response to the comparing indicating that the data read using the increased sensing reference level and the data read using the initial nominal value of the sensing reference level do not match, setting the increased sensing reference level as the current value of the sensing reference level.

6. The method as claimed in claim 1, wherein the reported current value of the sensing reference level is the highest value of the sensing reference level at which performing a read operation on memory cells over the plurality of address locations returns correct data.

7. The method as claimed in claim 1, comprising, in response to the one or more memory cells returning incorrect data when read:

storing the address location as a weakest address value; and storing an indication of the incorrect data as a fail data value.

8. A method of performing a reliability screen of a memory array including non-volatile memory cells, the method comprising:

programming each of a plurality of the non-volatile memory cells to a first data state;

determining a current value of a sensing reference level for a first address location of the memory array, the current value corresponding to a lowest value of the sensing reference level at which performing a read operation on one or more memory cells corresponding to the first address location returns correct data;

for each of a remaining plurality of address locations in the memory array:

reading one or more memory cells corresponding to the address location using the current value of the sensing reference level;

in response to the one or more memory cells returning incorrect data when read at the current value of the sensing reference level, updating the current value of the sensing reference level by incrementing the sensing reference level and then repeating the reading of the one or more memory cells; and in response to the one or more memory cells returning correct data when read at the current value of the sensing reference level, advancing to a next address location and repeating the reading and updating steps or the advancing step; and reporting the current value of the sensing reference level.

9. The method as claimed in claim 8, wherein the memory cells each comprise a floating gate metal-oxide semiconductor (MOS) transistor and the first data state corresponds to a programmed state of a floating gate MOS transistor.

10. The method as claimed in claim 9, wherein the sensing reference level is a reference current, reference voltage, or a control gate voltage.

11. The method as claimed in claim 8, wherein the first data state is a logical 0.

12. The method as claimed in claim 8, wherein determining the current value of a sensing reference level for the first address location comprises:

reading the one or more memory cells corresponding to the first address location using an initial nominal value of the sensing reference level;

decrementing the initial nominal value of the sensing reference level to obtain an decreased sensing reference level;

reading the one or more memory cells using the decreased sensing reference level;

comparing data read from the one or more memory cells using the decreased sensing reference level to data read from the one or more memory cells using the initial nominal value of the sensing reference level;

in response to the comparing indicating the data read using the decreased sensing reference level matches the data read using the initial nominal value of the sensing reference level, updating the decreased sensing reference level by decrementing the sensing reference level and repeating the steps of reading of the one or more memory cells using the decreased sensing reference level and comparing the data read using the decreased sensing reference level to the data read using the initial nominal value of the sensing reference level until the comparing indicates that the data read using the decreased sensing reference level and the data read using the initial nominal value of the sensing reference level do not match; and in response to the comparing indicating that the data read using the decreased sensing reference level and the data read using the initial nominal value of the sensing reference level do not match, setting the decreased sensing reference level as the current value of the sensing reference level.

13. The method as claimed in claim 8, wherein the reported current value of the sensing reference level is the lowest value of the sensing reference level at which performing a read operation on memory cells over the plurality of address locations returns correct data.

14. The method as claimed in claim 8, comprising, in response to the one or more memory cells returning incorrect data when read:

storing the address location as a weakest address value; and storing an indication of the incorrect data as a fail data value.

15. An integrated circuit comprising:

an array of programmable non-volatile memory cells; and test circuitry having sequential logic configured to apply addresses and at least one sensing reference level to the array, a read data store configured to store a data word corresponding to correct data for memory cells corresponding to an address location, a data comparator that compares a data word read from an address location of the array with contents of the read data store, and a first storage location, wherein the test circuitry is configured to perform a reliability screen of the array by:

programming each of a plurality of the non-volatile memory cells to a first data state;

determining a current value of a sensing reference level for a first address location of the array, the current value corresponding to a highest value of the sensing reference level at which performing a read operation on one or more memory cells corresponding to the first address location returns correct data;

storing the current value of the sensing reference level in the first storage location; and for each of a remaining plurality of address locations in the array:

(i) reading one or more memory cells corresponding to the address location using a nominal value of the sensing reference level to obtain correct data for the one or more memory cells;

(ii) storing, in the read data store, the correct data;

(iii) reading one or more memory cells corresponding to the address location using the current value of the sensing reference level;

(iv) using the data comparator to compare the data read from the one or more memory cells using the current value of the sensing reference level to the correct data;

(v) in response to the comparing step indicating that the one or more memory cells return incorrect data when read at the current value of the sensing reference level, updating the current value of the sensing reference level by decrementing the sensing reference level, storing the updated current value of the sensing reference level in the first storage location, and repeating (iii) to (v);

(vi) in response to the comparing step indicating that the one or more memory cells return correct data when read at the current value of the sensing reference level, advancing to a next address location and repeating (i) to (vi).

16. The integrated circuit as claimed in claim 15, wherein the memory cells each comprise a floating gate metal-oxide semiconductor (MOS) transistor and the first data state corresponds to an erased state of the floating gate MOS transistor.

17. The integrated circuit as claimed in claim 15, wherein the first data state is a logical 1.

18. The integrated circuit as claimed in claim 15, wherein, when the address location is the last of the remaining plurality of address locations, the current value of the sensing reference level at which the comparing step (vi) indicates that the one or more memory cells return correct data when read is stored in the first storage location.

19. An integrated circuit comprising:

an array of programmable non-volatile memory cells; and test circuitry having sequential logic configured to apply addresses and at least one sensing reference level to the array, a read data store configured to store a data word corresponding to correct data for memory cells corresponding to an address location, a data comparator that compares a data word read from an address location of the array with contents of the read data store, and a first storage location, wherein the test circuitry is configured to perform a reliability screen of the array by:

programming each of a plurality of the non-volatile memory cells to a first data state;

determining a current value of a sensing reference level for a first address location of the array, the current value corresponding to a lowest value of the sensing reference level at which performing a read operation on one or more memory cells corresponding to the first address location returns correct data;

storing the current value of the sensing reference level in the first storage location; and for each of a remaining plurality of address locations in the array:

(i) reading one or more memory cells corresponding to the address location using a nominal value of the sensing reference level to obtain correct data for the one or more memory cells;

(ii) storing, in the read data store, the correct data;

(iii) reading one or more memory cells corresponding to the address location using the current value of the sensing reference level;

(iv) using the data comparator to compare the data read from the one or more memory cells using the current value of the sensing reference level to the correct data;

(v) in response to the comparing step indicating that the one or more memory cells return incorrect data when read at the current value of the sensing reference level, updating the current value of the sensing reference level by incrementing the sensing reference level, storing the updated current value of the sensing reference level in the first storage location, and repeating (iii) to (v);

(vi) in response to the comparing step indicating that the one or more memory cells return correct data when read at the current value of the sensing reference level, advancing to a next address location and repeating (i) to (vi).

20. The integrated circuit as claimed in claim 19, wherein the memory cells each comprise a floating gate metal-oxide semiconductor (MOS) transistor and the first data state corresponds to a programmed state of the floating gate MOS transistor.

21. The integrated circuit as claimed in claim 19, wherein the first data state is a logical 0.

22. The integrated circuit as claimed in claim 19, wherein, when the address location is the last of the remaining plurality of address locations, the current value of the sensing reference level at which the comparing step (vi) indicates that the one or more memory cells return correct data when read is stored in the first storage location.

* * * * *